(12) United States Patent
Matsushima et al.

(10) Patent No.: US 8,164,902 B2
(45) Date of Patent: Apr. 24, 2012

(54) ELECTRONIC APPARATUS

(75) Inventors: Hitoshi Matsushima, Ryugasaki (JP);
Tadakatsu Nakajima, Kasumigaura (JP); Takayuki Atarashi, Tsuchiura (JP); Yoshihiro Kondo, Tsuchiura (JP); Hiroyuki Toyoda, Hitachinaka (JP); Tomoo Hayashi, Hitachinaka (JP); Akio Idei, Hadano (JP); Shigeyasu Tsubaki, Odawara (JP); Takumi Sugiura, Kashiwa (JP); Yasuhiro Kashirajima, Tokyo (JP)

(73) Assignees: Hitachi, Ltd., Tokyo (JP); Hitachi Plant Technologies, Ltd., Tokyo (JP)

( * ) Notice: Subject to any disclaimer, the term of this patent is extended or adjusted under 35 U.S.C. 154(b) by 68 days.

(21) Appl. No.: 12/544,153

(22) Filed: Aug. 19, 2009

(65) Prior Publication Data

US 2010/0073863 A1 Mar. 25, 2010

(30) Foreign Application Priority Data

Sep. 24, 2008 (JP) ................................. 2008-244242

(51) Int. Cl.
*H05K 7/20* (2006.01)
(52) U.S. Cl. ........ 361/700; 361/699; 361/719; 361/721; 165/80.4; 165/104.26; 165/104.33; 174/15.2
(58) Field of Classification Search ........................ None
See application file for complete search history.

(56) References Cited

U.S. PATENT DOCUMENTS

| | | | | |
|---|---|---|---|---|
| 6,388,882 B1 * | 5/2002 | Hoover et al. | ................ | 361/704 |
| 6,657,121 B2 * | 12/2003 | Garner | ......................... | 174/16.3 |
| 6,804,117 B2 * | 10/2004 | Phillips et al. | ................ | 361/700 |
| 6,972,365 B2 * | 12/2005 | Garner | ......................... | 174/16.3 |
| 7,012,807 B2 * | 3/2006 | Chu et al. | ...................... | 361/699 |
| 7,130,193 B2 * | 10/2006 | Hirafuji et al. | ................ | 361/700 |
| 7,231,961 B2 * | 6/2007 | Alex et al. | .................... | 165/80.4 |
| 7,599,184 B2 * | 10/2009 | Upadhya et al. | ............. | 361/699 |
| 7,719,837 B2 * | 5/2010 | Wu et al. | ....................... | 361/699 |
| 2005/0068728 A1 | 3/2005 | Chu et al. | | |
| 2006/0171117 A1 * | 8/2006 | Hamman | ...................... | 361/699 |
| 2006/0221560 A1 | 10/2006 | Seki | | |
| 2006/0254753 A1 | 11/2006 | Phillips et al. | | |
| 2007/0042514 A1 | 2/2007 | Wu et al. | | |
| 2009/0027856 A1 * | 1/2009 | McCoy | ......................... | 361/699 |

FOREIGN PATENT DOCUMENTS

JP 63-227099 9/1988

(Continued)

OTHER PUBLICATIONS

European Patent Office extended European search report on Application No. 09252004.8 dated Aug. 19, 2010; 6 pages.

*Primary Examiner* — Boris Chervinsky
(74) *Attorney, Agent, or Firm* — Foley & Lardner LLP

(57) ABSTRACT

An electronic apparatus, such as a blade server or the like, has a cooling system for efficiently cooling a plurality of heat generating semiconductor devices, such as a CPU, mounted on blades which is freely put on and taken off. The cooling system includes a thermosiphon which transfers heat from devices having relatively high heat generation, such as CPU or the like, to the outside of the apparatus, heat pipes which transfer heat of devices having relatively low heat generation to the thermosiphon, a thermal highway which is thermally coupled to the thermosiphon by the mounting of blades into a housing and collects and transfers the heat from the thermosiphon and the heat pipes, and a condenser which transfers the heat collected and transferred by the thermal highway outside a housing.

2 Claims, 11 Drawing Sheets

FOREIGN PATENT DOCUMENTS

| | | |
|---|---|---|
| JP | 06-004179 A | 1/1994 |
| JP | 07-122869 A | 5/1995 |
| JP | 2002-374086 A | 12/2002 |
| JP | 2005-222443 | 8/2005 |
| JP | 2006-285670 | 10/2006 |
| JP | 2007-072635 A | 3/2007 |

* cited by examiner

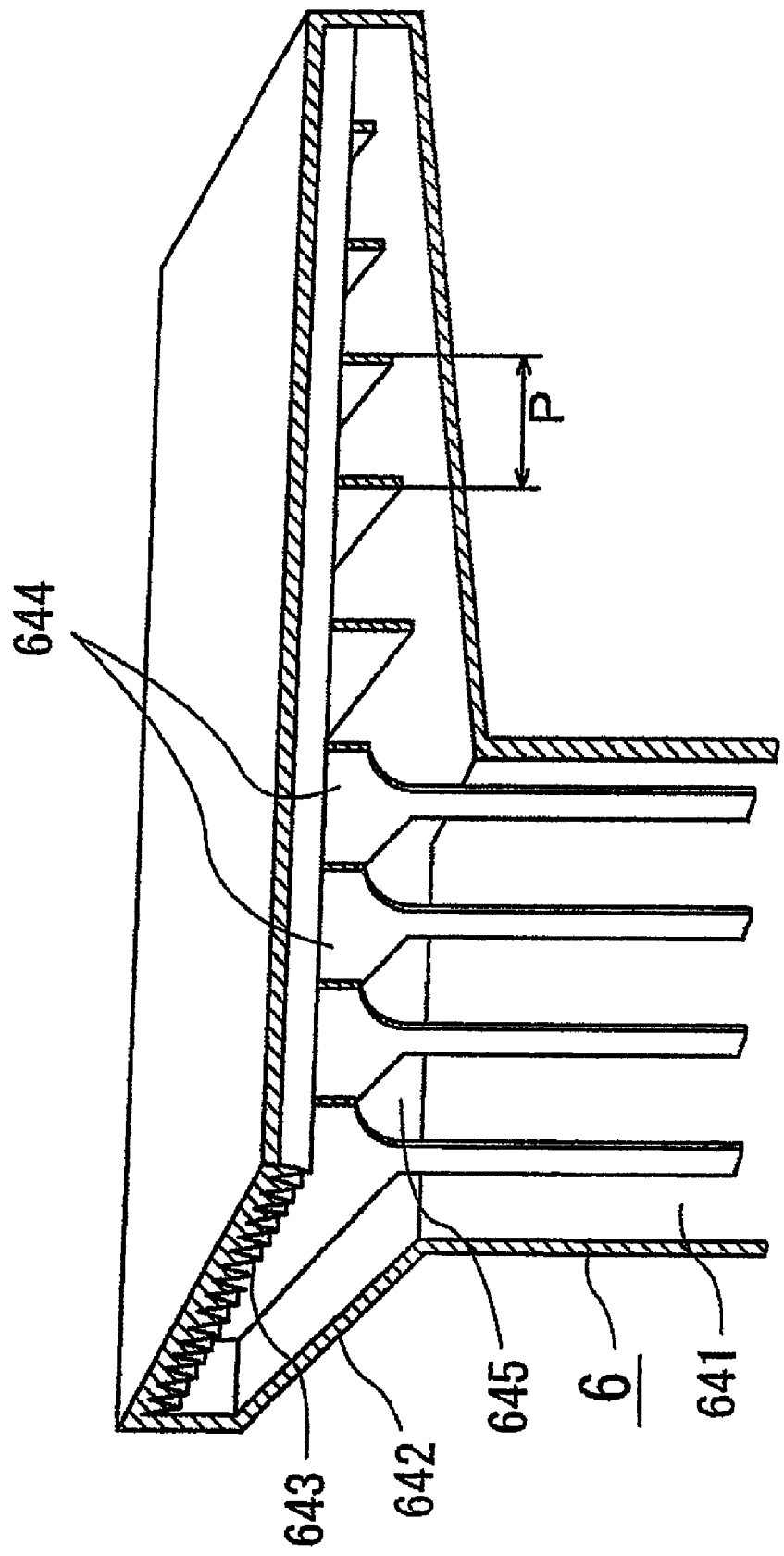

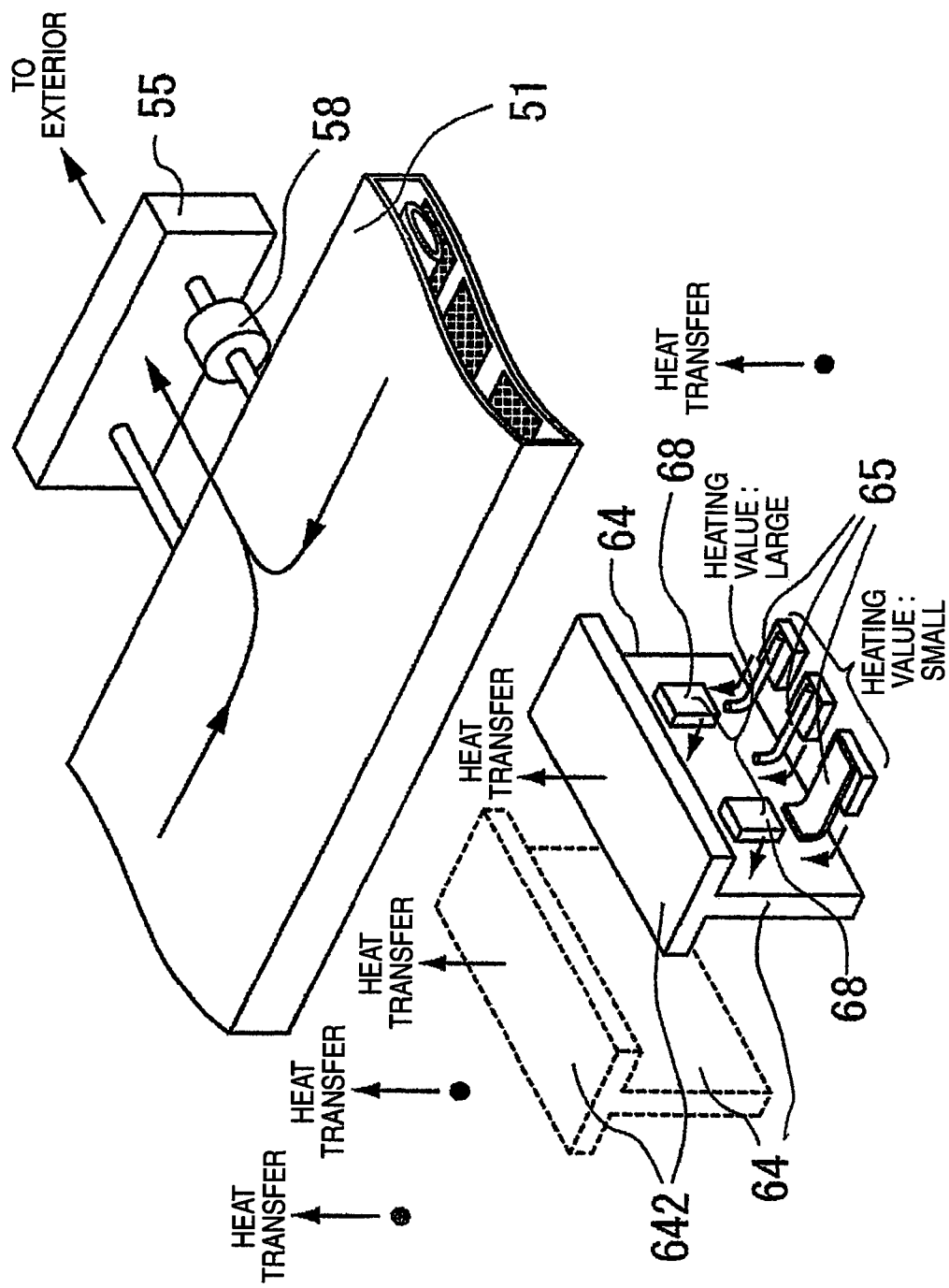

ELECTRONIC APPARATUS

FIELD OF THE INVENTION

The present invention relates to an electronic apparatus, as represented by a blade server, in which a plurality of heat generating elements is detachably mounted within a housing, and more particularly, to a cooling structure of an electronic apparatus which is capable of obtaining a good cooling effectiveness even in such an apparatus.

DESCRIPTION OF RELATED ART

In recent years, in an electronic apparatus represented by a blade server, semiconductor devices such as a central processing unit (CPU) and so on have been mounted on a circuit board within a plate-like housing called a "blade" along with memories and other electronic components, and such a plurality of blades has been densely mounted in a box-like rack. In addition, in recent years, semiconductor devices, such as a central processing unit (CPU) and so on, which are mounted within a corresponding blade, have increased in heat dissipation due to their high integration, high speed processing performance and further high functionality.

However, in general, if the temperature of a semiconductor device exceeds a particular value, the semiconductor device cannot maintain its performance but also, in some cases, may be damaged. Accordingly, temperature control by cooling or the like is required and there is a strong need for a technique for efficiently cooling semiconductor devices which have increased heat dissipation.

In addition, for electronic apparatuses such as servers and so on, a so-called rack-mount type has come into wide use since it allows flexible establishment of a system which meets maintenance and user's needs and also allows extension of the system according to changes in the needs of the user. Further, in such a rack-mount type server, it is possible to detachably select and arrange individual devices having different functions and performances so as to construct an electronic apparatus, and this has the advantage of facilitating system miniaturization.

With such a technical background, it is required that electronic circuit boards (so-called blades), on which semiconductor devices (such as CPUs and so on) increasing the heat dissipation are loaded, can be freely mounted within a rack, and its cooling device is expected to have high cooling capability to efficiently cool such blades. In addition, although many air-cooling devices have been conventionally employed, they have already approached a limit due to the above-mentioned circumstances. Accordingly, a new cooling system is required. For example, a cooling system using a refrigerant such as water or the like has been attracting attention.

As one of the conventional techniques related to the present invention, for example, JP-A-2002-374086 discloses a technique for directly cooling heating semiconductor devices in CPU blades freely mounted within a rack with a refrigerant by using a cooling jacket in the above-mentioned rack-mount type. More specifically, this document discloses a technique for detachably connecting the cooling jacket to a liquid cooling system within a blade server through an auto shut off valve.

In addition, JP-A-2007-72635 discloses a technique for coping with problems of space occupation and installation of a dedicated housing when mounting a liquid cooling system in an electronic apparatus including a server.

In addition, JP-A-7-122869 discloses a technique for thermally coupling semiconductor devices on a CPU blade to an external cooling system by using a socket expander in order to easily put on and take off a CPU blade. In addition, JP-A-6-4179 discloses a technique for thermally coupling semiconductor devices suitable for an extra-large computer and a super computer to an external cooling system by using a pipe for supplying cooling water.

However, in the above-mentioned conventional techniques, it was difficult to obtain a cooling capability necessary for an electronic apparatus represented by a blade server, which has greatly increased heating value due to high integration, high speed processing performance and further high functionality of semiconductor devices. In particular, in recent blade servers, a CPU blade detachably mounted within a rack for maintenance or the like is required to be small-sized and lightweight devices, and has been further limited in its capacity. Accordingly, with a further requirement in terms of ecological measures, there is a strong need of a cooling method and device for electronic apparatuses, which is more effective and efficient in reliably cooling semiconductor devices even in such a narrow space.

SUMMARY OF THE INVENTION

It is therefore an object of the invention to provide an electronic apparatus including the above-mentioned blade server and a new cooling system which is capable of efficiently and optimally cooling a heat generating body including, particularly, semiconductor devices on a detachable CPU blade.

The present invention is attained on the basis of recognition of the present inventors that, in electronic apparatuses having a plurality of heating semiconductor devices highly integrated within a narrow space, particularly such as the above-mentioned blade server, a cooling effectiveness can be achieved with power saving at low costs by efficiently collecting the generated heat from various devices and conveying the collected heat to the air (thermal transfer), which may be called "free cooling."

To accomplish the above object, according to the present invention, there is provided an electronic apparatus in which a plurality of semiconductor devices is mounted on each of a plurality of electronic circuit boards which is detachably mounted within a housing, and a cooling system is further provided for cooling the semiconductor devices on the plurality of electronic circuit boards mounted in the electronic apparatus. The plurality of semiconductor devices mounted on each of the electronic circuit boards has a different heat dissipation. The cooling system includes: a first heat transferring unit which is provided for each of the electronic circuit boards and transfers heat from a first semiconductor device having a relatively high heat dissipation among the plurality of semiconductor devices mounted on the electronic circuit board to an outside thereof; a second heat transferring unit which is provided for each second semiconductor devices having heat dissipation lower than that of the first semiconductor device on the electronic circuit board and transfers heat from the second semiconductor devices to the first heat transferring unit; a third heat transferring unit, which is provided within the housing of the electronic apparatus, is thermally coupled to the first heat transferring unit by mounting of the electronic circuit board into the housing, and thereby collects and transfers heat from the first heat transferring unit and the second heat transferring unit; and a radiating unit which transfers the heat collected and transferred by the third heat transferring unit outside the housing. Further, heat transfer capacity by the first heat transferring unit is set to be higher than heat transfer capacity by the second heat transferring unit and lower than heat transfer capacity by the third heat transferring unit.

According to the present invention, in the electronic apparatus, preferably, each of the electronic circuit boards is received in a respective housing, some portion of the first heat transferring unit is thermally coupled to a surface of the first semiconductor device, and another portion of the first heat transferring unit is opened to and arranged on the top surface of the housing. Further, preferably, some portion of the third heat transferring unit is arranged to be opposite to the opened surface of the first heat transferring unit in the housing of the electronic apparatus.

According to the present invention, further preferably, a thermal connector is interposed between the opened surface of the first heat transferring unit and the opposite surface of the third heat transferring unit. In this case, preferably, one end of the second heat transferring unit is thermally coupled to a surface of the second semiconductor devices and the other end is thermally coupled to one surface of the first heat transferring unit. In addition, according to the present invention, preferably, the first heat transferring unit is constituted by a thermosiphon, the second heat transferring unit is constituted by a heat pipe, and the third heat transferring unit is constituted by a thermal highway. Furthermore, according to the present invention, there is provided an electronic apparatus in which the electronic apparatus is a rack-mount type blade server and the electronic circuit boards are blades constituting the blade server.

According to the above-described present invention, various kinds of heat dissipating semiconductor devices, such as CPU, which are densely mounted in a plurality of blades detachably mounted within an electronic apparatus, can be efficiently cooled at low cost by using heat transferring means of high capability such as a thermal highway, a thermosiphon and so on and by optimally using thermo devices such as heat pipes and so on. Therefore, the present invention has remarkable advantages in the miniaturization and power saving of electronic apparatuses in which a plurality of heat dissipating bodies is densely mounted, such as rack-mount type blade servers.

Other objects, features and advantages of the invention will become apparent from the following description of the embodiments of the invention taken in conjunction with the accompanying drawings.

BRIEF DESCRIPTION OF SEVERAL VIEWS OF DRAWING

FIGS. 5A and 5B are sectional views showing an example of a structure of a thermosiphon constituting the cooling system for electronic apparatus of the present invention;

FIG. 9 is an explanatory view showing an operation of the cooling system according to the present invention in a blade server, which is representative of an electronic apparatus.

DETAILED DESCRIPTION OF THE INVENTION

Hereinafter, embodiments according to the present invention will be described in detail with reference to the accompanying drawings.

Figure 1:
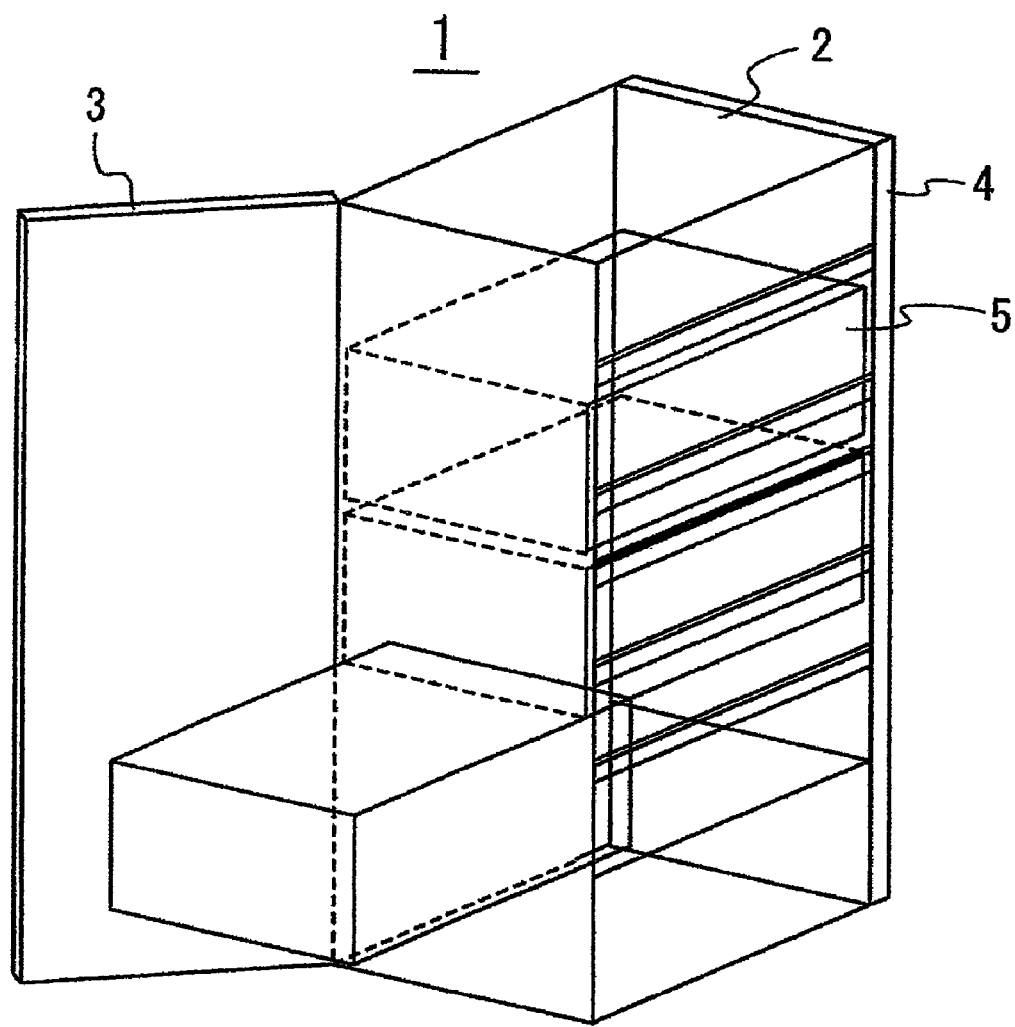
FIG. 1 is an external perspective view of a rack-mount type blade server employing a cooling system for electronic apparatus according to the present invention.

FIG. 1 is an external perspective view of a blade server representative of an electronic apparatus to which a cooling system according to the present invention is applied, particularly, a rack-mount type blade server. In the figure, a rack 1 includes a housing 2 and covers 3 and 4 (3 denotes a front door and 4 denotes a rear door). Inside the rack 1 is provided a plurality (three in this example) of chassis 5 formed in a predetermined shape and dimension based on a particular standard such as, for example, IEC (International Electrical Commission) Standard/EIA (The Electrical Industries Association) Standard. A plurality of blades having respective functions is arranged and inserted in a lengthwise direction in each of the plurality of chassis 5, which will be described in detail later. These blades can be freely and optionally inserted in and drawn out of the chassis 5 and can be freely arranged and mounted, thus providing both flexibility and expansibility of a system configuration.

Figure 2:
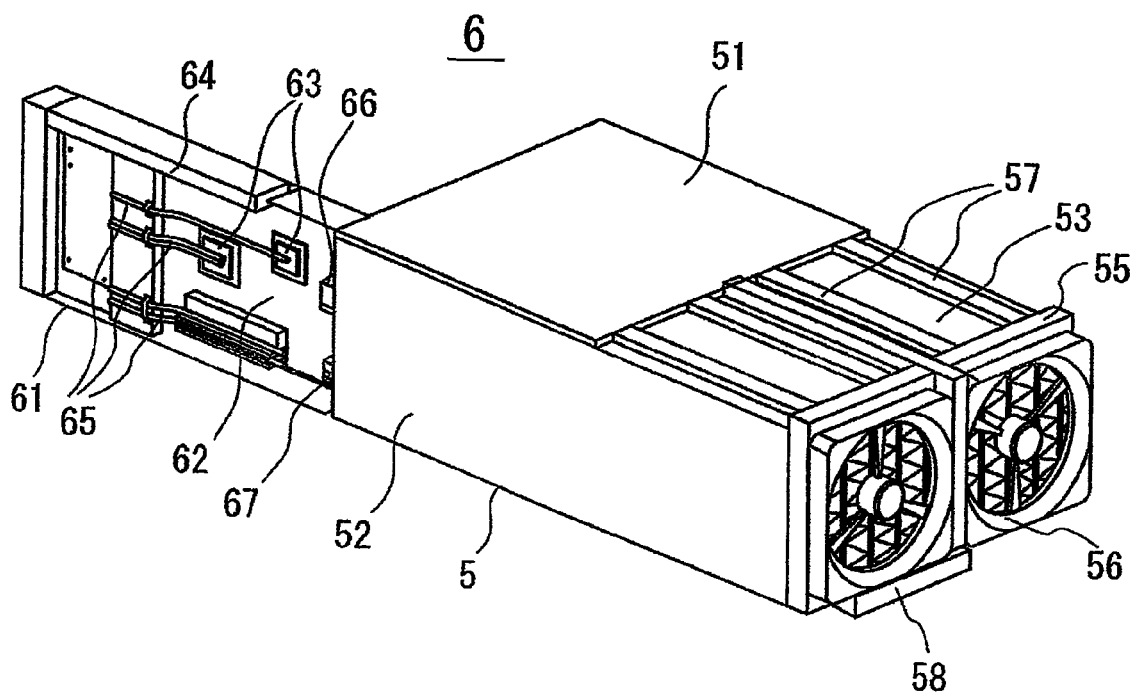
FIG. 2 is an external perspective view showing one chassis provided within a rack of the blade server, along with blades which can be inserted in and drawn out of the chassis.

FIG. 2 shows one chassis 5 provided within the rack 1, along with a plurality of blades 6 which can be inserted in and drawn out of the chassis 5. In the figure, reference numeral 51 denotes a heat sink mounted on the top surface of the chassis 5. The heat sink constitutes means 51 for transferring a large quantity of heat, which is called "thermal highway," which will be described detail later.

Figure 3:
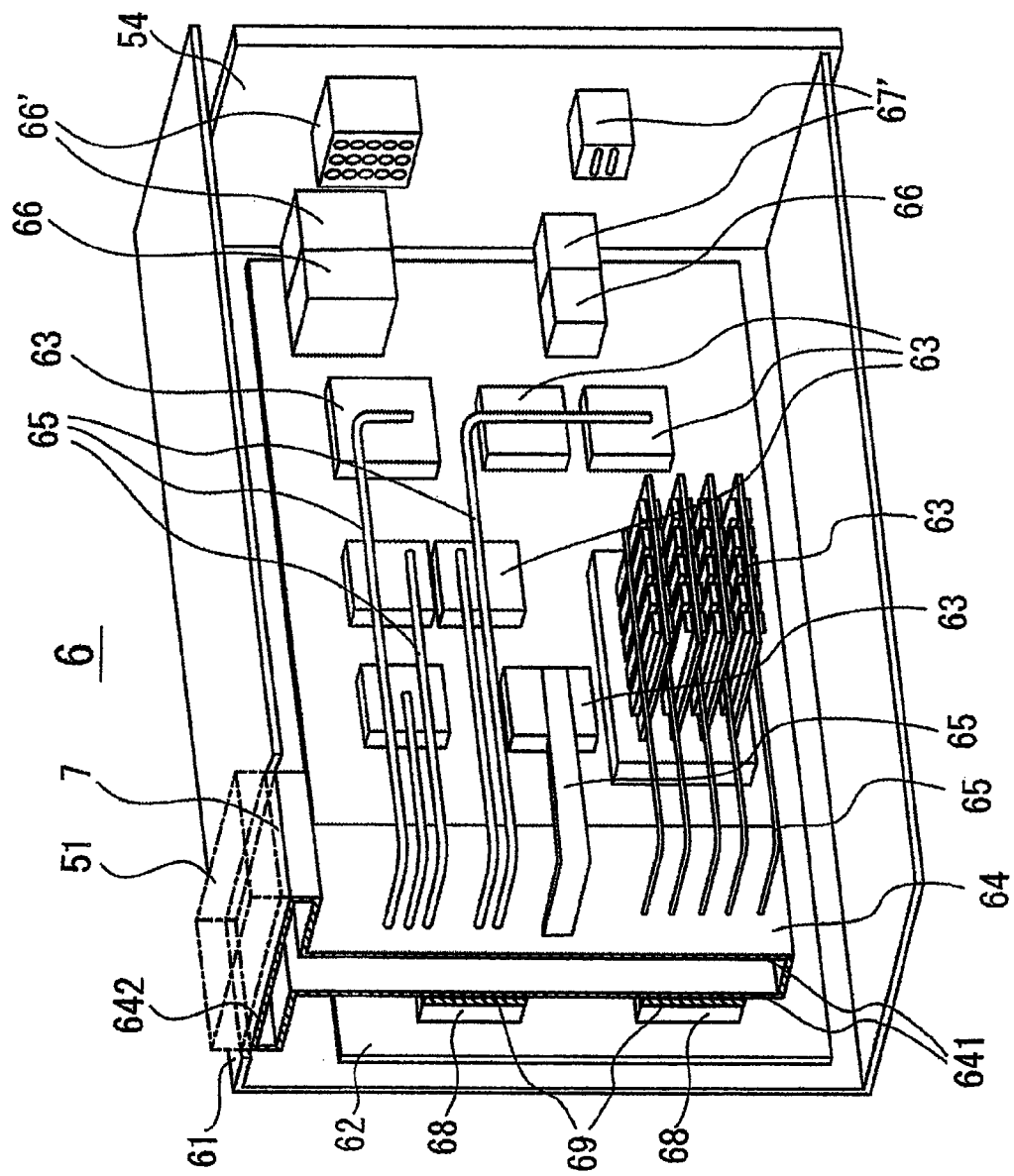
FIG. 3 is a view showing internal details of one blade to be inserted in the chassis.

As shown in FIG. 2, each chassis 5 has a so-called blade receiving space 52 in/out of which a plurality (for example, ten or so) of plate-like blades 6 can be inserted/drawn, in the front side (left side in FIG. 2), and a space 53 (for example, a power supply room) in which devices such as a power supply and so on are contained, in the rear side (right side in FIG. 2), with both spaces 52 and 53 partitioned by a backboard 54 (see FIG. 3). In the rear side of the power supply room are mounted two pairs of condensers 55 (including an air-cooled condenser 55 and a fan 56 in this example). In the figure, reference numeral 57 denotes a pipe connected between the thermal highway 51 and the air-cooled condenser 55 and reference numeral 58 denotes a saturator (return) pump for forcedly returning saturated water generated in the air-cooled condenser 55 to the thermal highway 51, which will be described detail later.

As clearly shown in FIGS. 2 and 3, each blade 6 inserted in the chassis 5 has a wiring board 62 mounted on a blade chassis 61. On the surface of the wiring board 62 are mounted, for example, a plurality of semiconductor devices 63 (some thereof being shown in the figures by reference numeral 63) which are a source of heat dissipation, such as CPU (Central Processing Unit), various kinds of LSIs, memories and so on, which are required to accomplish the functions of the blades. Although not shown in the figures, a substantial T-like thermosiphon 64 (which will be described in detail later) is thermally coupled to the CPU which is the main source of heat dissipation (specifically, connected to the surface of the CPU), and additionally, a plurality of heat pipes 65 for efficiently transferring heat from the semiconductor devices 63 on the wiring board 62 to the thermosiphon 64 is thermally coupled to the thermosiphon 64. In the figures, reference numerals 66 and 67 denote connectors (signal connector 66 and power connector 67) provided at a blade side in order to automatically obtain a required electrical connection with the chassis 5 by inserting the blade 6 in the chassis 5, which will be described later.

FIG. 3 shows internal details of one blade 6 to be inserted in the chassis 5. As shown, each blade 6 includes the blade chassis 61 on which the wiring board 62 is mounted, and semiconductor devices, such as various kinds of LSIs, memories and so on, mounted on the wiring board 62 constituting the blade, particularly, one or more (two in the example) CPUs (Central Processing Units) 68 which are the main source of heat dissipation, are thermally coupled to one side of the thermosiphon 64 via a heat transfer member 69 such as a thermal conductive grease or thermal conductive sheet 69.

In this example, a plurality of heat pipes 65, 65, . . . is mounted on the other side of the thermosiphon 64, and additionally one end of each heat pipe 65 is mounted on a surface of devices having heat dissipation less than that of the CPU 68, for example, MCH (Memory Controller Hub) or other LSIs or memories (collectively denoted by reference numeral 63 in the figures). The heat pipes 65, the thermosiphon 64 or the devices 63 may be mounted by using, for example, a thermal conductive adhesive agent or an adhesive tape. That is, in consideration of maintenance of the blade, the bonding means is preferably one that allows the heat pipes 65 to be relatively easily detached from the thermosiphon 64 and the devices 63.

In addition, as shown in the figures, each heat pipe 65 is preferably mounted with a connection to the thermosiphon 64 inclined in order to promote circulation of a refrigerant within the heat pipe 65. In the figures, reference numeral 54 denotes a backboard to partition the space 53 (see FIG. 2, for example, referring to as a power supply room) for containing devices including the above-mentioned power supply and so on. As apparent from the figures, on the backboard are provided connectors 66' and 67' (signal connector 66' and power connector 67') at positions corresponding to the connectors 66 and 67 at the blade 6 side, so that a required electrical connection with the chassis 5 can be automatically obtained by inserting the blade 6 in the chassis 5.

FIG. 3 also shows a section of the thermosiphon. As apparent from this section, the thermosiphon 64 includes a plate (box)-like evaporator (boiling) part (or a cooling part) 641 extending in a vertical direction, with the CPU 68 and the heat pipes 65 thermally coupled to both walls of the thermosiphon 64, and a condenser part (or a thermal coupling part) 642 arranged above the evaporator (boiling) part and thermally coupled to the thermal highway 51 which acts as a means for transferring a large quantity of heat. Reference numeral 7 denotes a so-called thermal conductive contact point (thermal connector) which acts as a means for effectively thermally coupling the condenser part (or the thermal coupling part) 642 of the thermosiphon 64 to the thermal highway 51 which acts as a means for transferring a large quantity of heat, which will be described in detail later.

Subsequently, although the general configuration has been described in the above, various components constituting the cooling system applied to the electronic apparatus (particularly, a server) according to the present invention will be individually described.

<Heat Pipe>

Figures 4A, 4B, 4C:
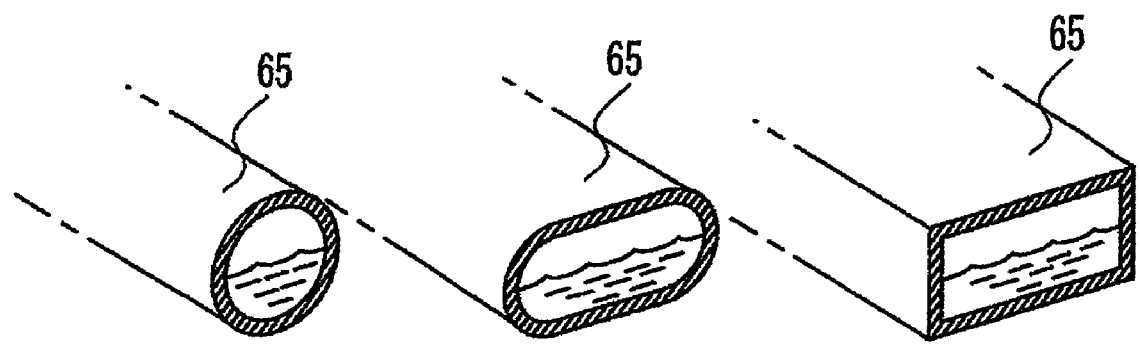
FIGS. 4A to 4C are sectional views showing an example of a structure of a heat pipe constituting the cooling system for electronic apparatus of the present invention.

As shown in FIGS. 4A to 4C, each heat pipe 65 is formed by sealing a refrigerant, such as water, under a reduced (low) pressure, in an internal space of a tube (hollow body) which is circular, elliptical or rectangular in its section and is made of metal material or the like having excellent (high) thermal conductivity, such as copper or the like. By thermally coupling one end of the heat pipe 65 to the devices 63 (see FIG. 3) having relatively low heat dissipation, such as the various LSIs, memories and so on, while thermally coupling the other end to the thermosiphon 64, the heat from the devices 63 having relatively low heat dissipation is effectively transferred to the thermosiphon 64. Although not shown here, for connection to the devices 63 and the thermosiphon 64, it is preferable that each heat pipe 65 has its inner wall formed by, for example, a pipe with an internal groove or a mesh wick in order to promote evaporation (boiling) and condensation of the refrigerant sealed inside.

<Thermosiphon>

Figure 5B:
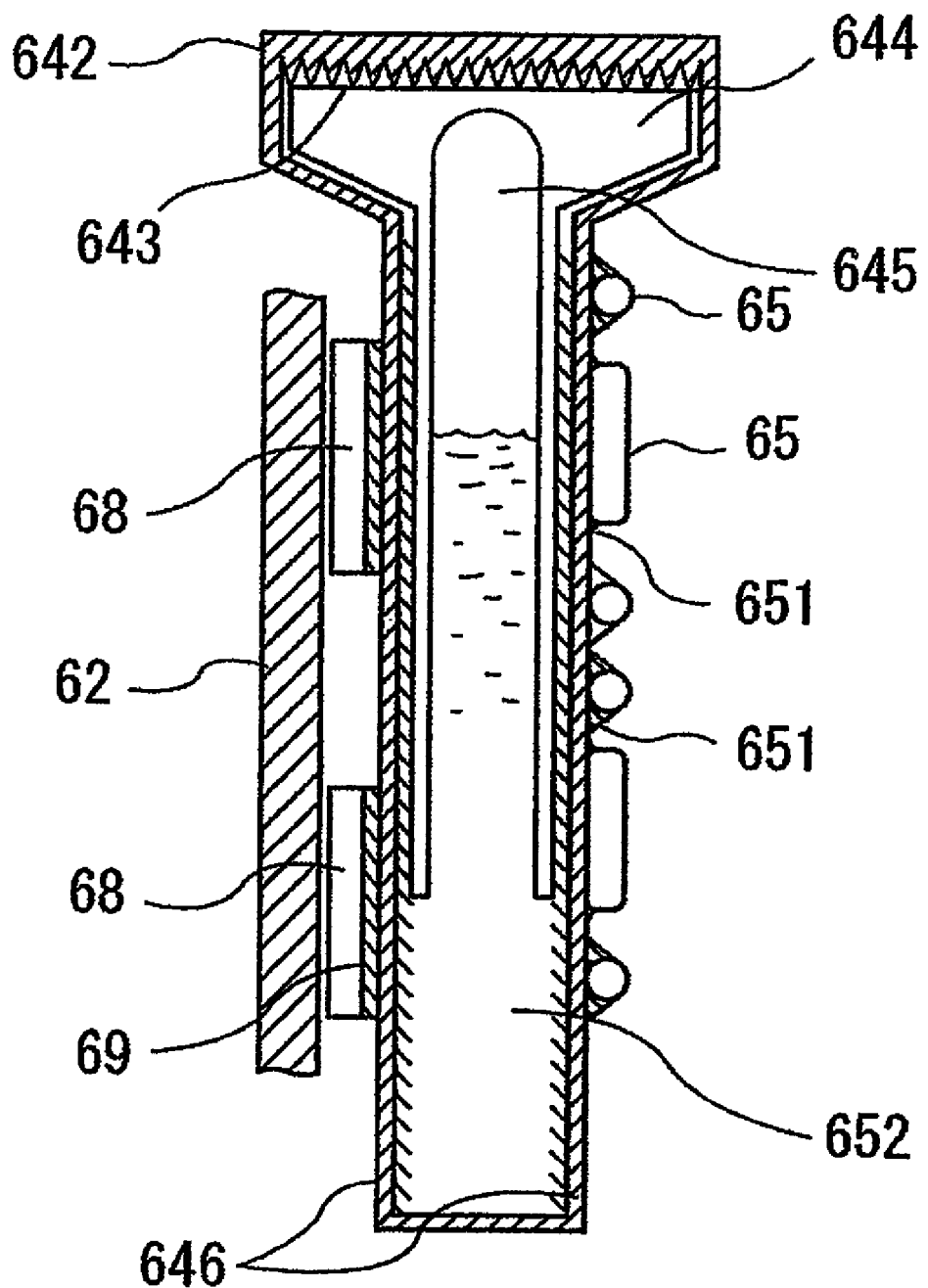

FIGS. 5A and 5B show internal details of the thermosiphon. As shown, the thermosiphon 64 is made of metal material or the like having excellent (high) thermal conductivity, such as copper, like the heat pipe, and includes the evaporator part (or the cooling part) 641 extending in the vertical direction and the condenser part (or the thermal coupling part) 642 which is located above the evaporator part and extends along the bottom surface (heat transfer surface) of the thermal highway 51 which will be also described below. As shown in FIG. 5A, on the bottom surface of an upper wall (that is, top surface of the inner wall) of the condenser part (or the thermal coupling part) 642 are formed condensing fins 643 along one direction (for example, a longitudinal direction) thereof, by using, for example, Thermo Excel C (Registered Trademark by Hitachi Cable) or the like, and additionally, a plurality of condensate exclusion/guide fins 644 is mounted at an equal interval (P) perpendicularly to the direction in which the condensing fins 643 extend. The condensate exclusion/guide fins 644 further extend to the bottom in the internal space of the evaporator part (or the cooling part) 641, and additionally the central portion thereof is cut into a "U"-shape to form a steam pass 645.

FIG. 5B shows a section including the evaporator part (or the cooling part) 641 of the thermosiphon 64. As apparent from this figure, in the above-described thermosiphon whose section is approximately "T"-shaped, a porous heat transfer surface 646 using Thermo Excel E (Trademark registered by Hitachi Cable) or the like is formed in the inner wall of the evaporator part (or the cooling part) 641 extending downward, i.e., in the vertical direction, from the condenser part (or the thermal coupling part) 642. It is shown in this figure that the evaporator part (or the cooling part) 641 of the thermosiphon 64 is mounted on the wiring board 62 in one wall thereof (at the left side of the figure) and is connected to the surface of two CPUs 68, which are the main source of heat dissipation of the blade, through a heat transfer member 69 such as a thermal conductive grease or a thermal conductive sheet, and additionally the heat pipes 65, which transfer heat from the devices 63 having relatively low heat dissipation, such as the various LSIs, memories and so on, are mounted in the other wall thereof (at the right side of the figure). In the figure, reference numeral 651 denotes a bonding member for bonding the heat pipes 65 to the thermosiphon 64, such as, for example, an adhesive agent or an adhesive tape. Although not shown here, grooves may be formed in advance on a portion of the surface of the thermosiphon 64 so that the heat pipes can be inserted and fixed in the grooves.

A refrigerant 652, such as water, is sealed in the inside of the above-described thermosiphon 64 under a reduced (low) pressure. Accordingly, the internal refrigerant is boiled (evaporated) into a gas state and rises in a boiling portion of the evaporator part (or the cooling part) 641 (a portion surrounded by the heat transfer surface 646) due to the heat from the CPU 68, which is the main source of heat dissipation, and additionally heat from the devices 63, such as various LSIs, memories and so on, moves to the condenser part (or the thermal coupling part) 642, then is condensed into a liquid by transferring heat to the thermal highway 51, and finally returns to the evaporator part along the condensate exclusion/guide fins 644. By repeating this cycle, heat from the various devices 63 on the wiring board 62, including the CPU 68, which is the main source of heat dissipation of the blade, is efficiently collected and transferred to the thermal highway 51.

<Thermal Highway>

Figure 6:
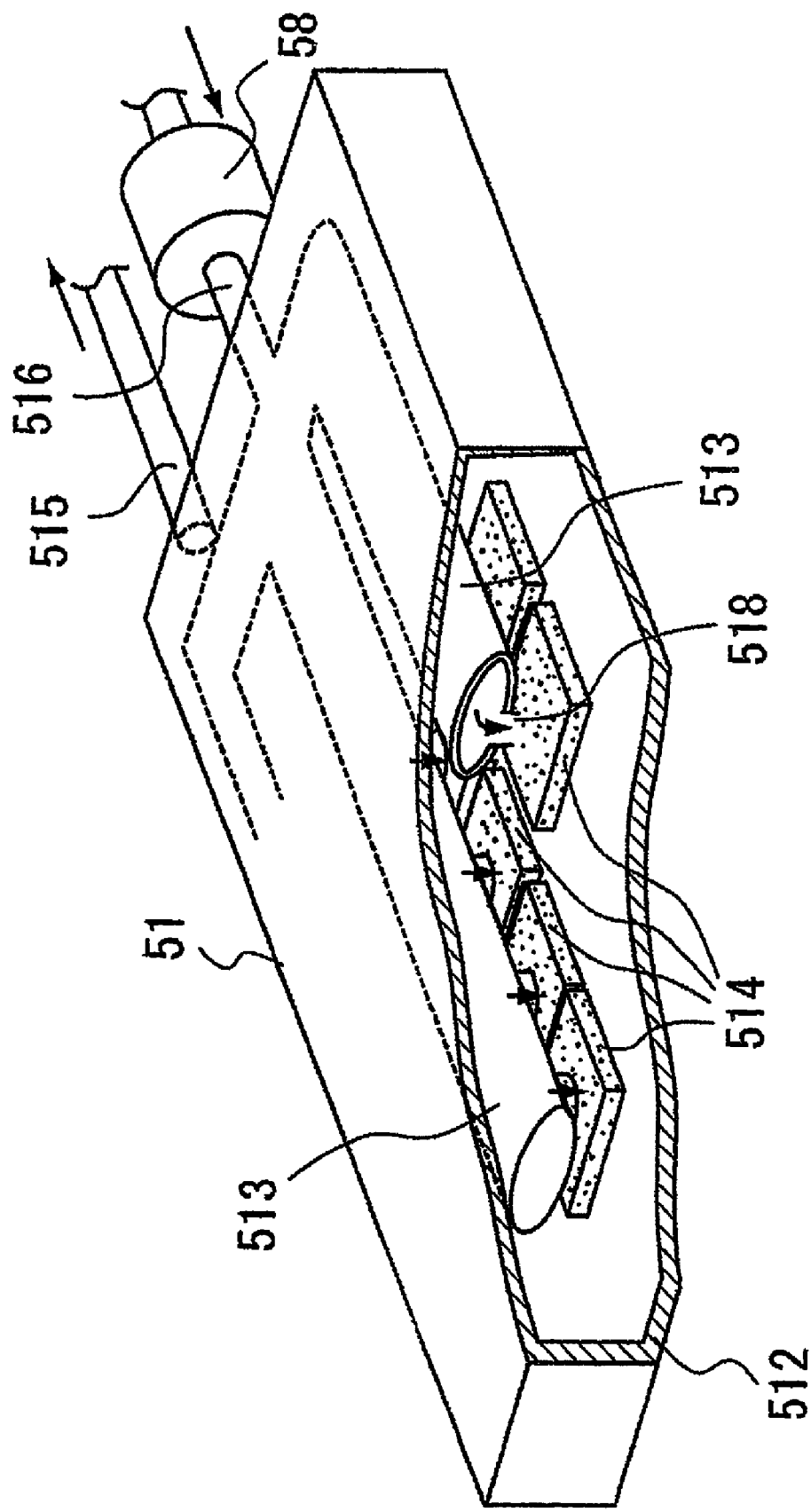
FIG. 6 is a sectional view showing an example of a structure of a thermal highway constituting the cooling system for electronic apparatus of the present invention.

Next, an internal detailed structure of the thermal highway 51 will be described with reference to FIG. 6. Like the above-described thermosiphon, the thermal highway 51 has a plate-like chamber (housing) 512 made of metal material having excellent (high) thermal conductivity, such as copper or the like. In the inside of the thermal highway 51 is arranged a liquid spray pipe (or a liquid distribution supply pipe) 513 and additionally is provided a plurality of porous vaporization accelerators 514 along the liquid spray pipe in the bottom surface thereof. A pipe 515 for guiding refrigerant steam generated in the chamber 512 to the condenser 55, which will be also described below, is mounted in a portion of the chamber (housing) 512, and a pipe 516 for guiding condensed liquid refrigerant from the condenser 55 is mounted in one end of the liquid spray pipe (or the liquid distribution supply pipe) 513. In the figure, reference numeral 58 denotes a pump (saturated water pump) for forcing condensate from the condenser 55 introduced into the liquid spray pipe 513, and reference numeral 518 denotes nozzles (ejecting nozzles) formed in the bottom side of the liquid spray pipe 513. It can be seen from this figure that these nozzles 518 are formed corresponding to the position of the vaporization accelerators 514.

Specifically, the thermal highway 51 efficiently evaporates (vaporizes) the condensate dropped from the liquid spray pipe 513 through the vaporization accelerators 514 using heat transferred from a plurality of above-described thermosiphons 64, and then transfers the evaporated refrigerant steam to the condenser 55 via the pipe 515. By repeating this operation, a large quantity of heat transferred from the plurality of thermosiphons 64 in the blades is efficiently transferred to the condenser 55.

In addition, like the above thermosiphon 64 and the heat pipe 65, the internal pressure of the chamber 512 of the above-described thermal highway 51 is substantially held at the saturated steam pressure of pure water which is a liquid refrigerant. That is, since the saturated steam pressure of pure water is 101000 Pa at 100° C., 19900 Pa at 60° C., 12300 Pa at 50° C., and 7830 Pa at 40° C., when the temperature of the chamber used is set to fall within a range of 40° C. to 60° C., the chamber is held at about 1/10 of the atmospheric pressure (saturated steam pressure at 100° C.).

<Thermal Connector>

A thermal connector (thermal conductive contact point) 7 (see FIG. 3) is a means used to effectively thermally couple the thermosiphon 64 provided on the blade side, particularly between the top surface of the condenser part (or the thermal coupling part) 642, and the bottom surface of the thermal highway 51, when the above-described blade 6 is inserted and mounted in the chassis 5.

Figure 7:
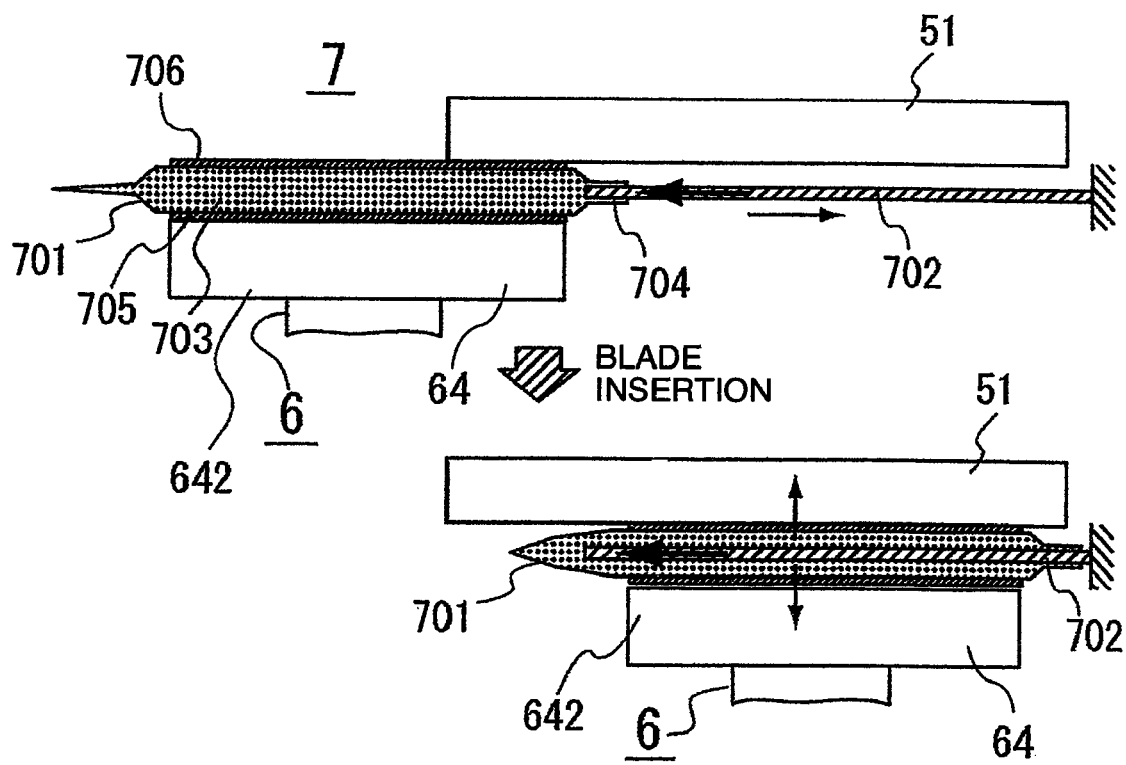
FIG. 7 is a sectional view showing an example of a structure of a thermal connector constituting the cooling system for electronic apparatus of the present invention.

For example, as shown on the upper side of FIG. 7, the thermal connector 7 includes a balloon bag 701 which is mounted on the top surface of the condenser 642 of the thermosiphon 64 and is made of material having excellent thermal conductivity, such as copper, aluminum, carbon graphite or the like, and a plate-like member 702 also made of material having excellent thermal conductivity. The balloon bag 701 is filled with thermal conductive grease 703, and additionally an O-ring 704 is provided at one end of the balloon bag 701 (the right end in the figure). In addition, a thermal conductive adhesive agent 705 is applied between the bottom surface of the balloon bag 701 and the top surface of the condenser 642 of the thermosiphon 64, and thermal conductive grease or a sheet 706 is provided at a contact surface of the top surface of the balloon bag 701 and the thermal highway 51.

With the above-described thermal connector 7, as also shown on the lower side of FIG. 7, by inserting the blade 6 into the chassis 5, the plate-like member 702 is inserted into the balloon bag 701 via the O-ring 704 and then the grease within the balloon bag is pressurized to expand the balloon bag 701 (as indicated by the arrows in the figure), thereby making it possible to secure a effective thermally coupling state between the thermosiphon 64 and the thermal highway 51.

<Condenser>

The condenser 55 is a means for additionally transferring heat of the thermal highway 51, which transfers heat collected from a plurality of sources of heat dissipation, including the CPU and various LSIs on each blade 6 in the blade server, out of the server. As one way for this, for example, an air-cooled condenser 55a shown in FIG. 8A or a water-cooled condenser 55b shown in FIG. 8B is employed.

Figure 8A:
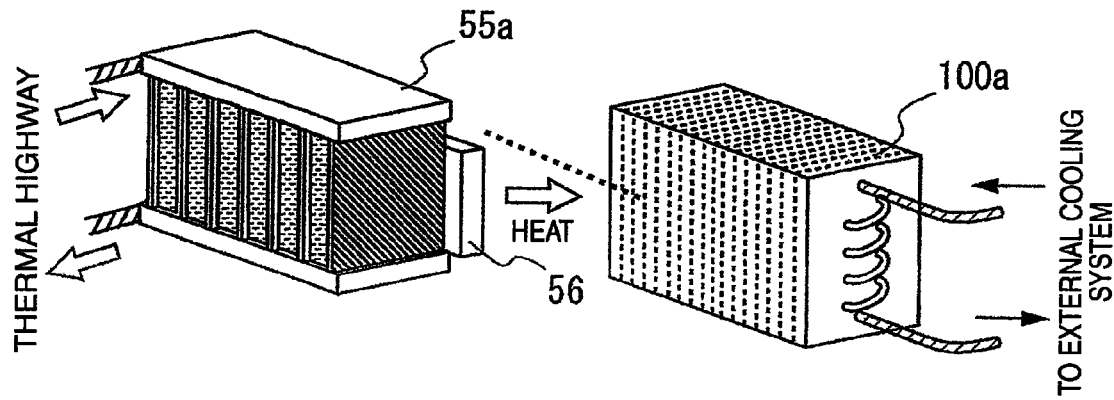
FIGS. 8A and 8B are sectional views showing an example of a structure of a condenser constituting the cooling system for electronic apparatus of the present invention.
Figure 8B:
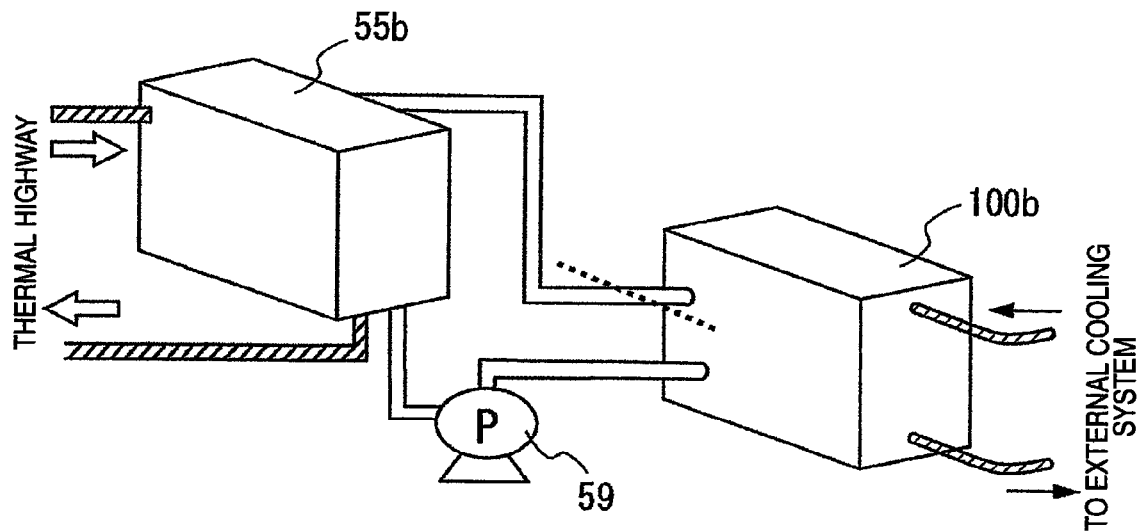

First, as apparent from the figure, the air-cooled condenser 55a shown in FIG. 8A is an external cooling system including a condenser provided with a plurality of fins between pipes, and a fan 56 for supplying air to the condenser, which will be also described later. The heat of the thermal highway 51 is transferred to, for example, a free cooling radiator 100a (of an air-cooling type) constituting a free cooling system.

On the other hand, as apparent from the figure, the water-cooled condenser 55b shown in FIG. 8B transfers heat to a liquid refrigerant supplied in the condenser, and thereby, a free cooling radiator 100b (of an water-cooling type) constituting a free cooling system, which is an external cooling system and will be also described later, transfers heat from the thermal highway 51. In the figure, reference numeral 59 is a pump for transferring heat from the thermal highway 51 to the free cooling radiator. The above-mentioned free cooling radiator is for example arranged at the rear door 4 of the blade server.

Subsequently, an operation of the cooling system according to the present invention, constituted by the above-described components, in the blade server representative of electronic apparatuses will be described with reference to FIG. 9.

As apparent from this figure, according to the present invention, in each blade, a device having high heat dissipation, that is, the CPU 68 which is the main source of heat dissipation, among the various heat dissipating devices mounted on the wiring board constituting the blade server, is directly thermally coupled to the thermosiphon 64 arranged in each blade. That is, the CPU 68, which is a semiconductor device having high heat dissipation, contacts a cooling surface of the thermosiphon 64, thereby directly transferring heat of the CPU to the thermosiphon.

On the other hand, except for devices requiring no cooling, semiconductor devices having low heat dissipation, such as the above-described various LSIs, memories and so on contact one end of the heat pipe 65 while the other end of the heat pipe 65 is thermally coupled to the thermosiphon 64. Accordingly, heat from the semiconductor devices 63 having low heat dissipation are also transferred to the thermosiphon 64 via the heat pipes 65.

In addition, the thermosiphon 64, which collected heat from the plurality of heat pipes 65 and heat directly transferred from the cooling surface, further transfers the collected heat to the thermal highway (evaporation type heat transfer device) 51 thermally coupled to the top side of the thermosiphon 64. That is, the thermosiphon 64 opens an outer surface of the top wall forming the condenser part (or the thermal coupling part) 642 to the top side of the blade chassis 61, while the bottom surface of the thermal highway 51 is arranged to face the opened surface of the thermosiphon 64, thereby effectively securing thermal coupling therebetween. Additionally, when each blade 6 is inserted in the chassis 5, by providing the thermal connector (thermal conductive contact point) 7 for thermally coupling the thermosiphon 64 to the thermal highway 51, it is possible to secure effective thermal coupling. That is, in the cooling system according to the present invention, instead of air-cooling a heat dissipating body such as CPU by flowing air over a blade surface as is conventional, it is possible to significantly reduce the number of rotations of a cooling fan, which results in power saving preferably from the standpoint of ecology, since the heat dissipation is recovered by the heat pipes or the thermosiphon.

In addition, according to the above-described operation, the thermal highway 51 collects heat from a plurality of blades 6 inside the blade server, particularly inside each chassis 5 provided in the rack 1, and then transfers the collected heat to the condenser 55 for transferring the heat to the outside of the apparatus.

Specifically, as shown in the figures, heat from devices having relatively low heat dissipation is once collected in the thermosiphon 64 by using the heat pipes 65, while heat from the CPU having high heat dissipation is collected in the thermosiphon 64 having higher cooling capability by directly coupling the CPU to the thermosiphon 64. Accordingly, heat from the plurality of heat pipes and thermosiphons is additionally and efficiently transferred to the outside of the apparatus through the condenser 55 by using the thermal highway 51 having high thermal conductive capability due to the employment of forced thermal conduction. More specifically, in order to realize the above-described function, the above-described heat pipes 65, thermosiphon 64 and thermal highway 51 have the following relationship for heat transfer capacity $Q_{TH}$:

$$Q_{TH} \text{ heat pipe} < Q_{TH} \text{ thermosiphon} < Q_{TH} \text{ thermal highway}$$

In addition, as described above, the CPU having high heat dissipation is cooled by being directly thermally coupled to the surface of the evaporator part (or the cooling part) 641 of the thermosiphon 64. As such unlike conventional techniques, limitations, such as the securing of air flow for the blades, are not required in determining the arrangement of CPU mounted on the wiring board 62. This results in higher density of devices mounted on the wiring board (high integration) and thus miniaturization of electronic apparatuses such as rack-mount type blade servers. In addition, as apparent from the above description, by using a free cooling system for the cooling of various devices constituting the electronic apparatus, it is possible to achieve a cooling effectiveness with more power saving at lower costs.

Figure 10:
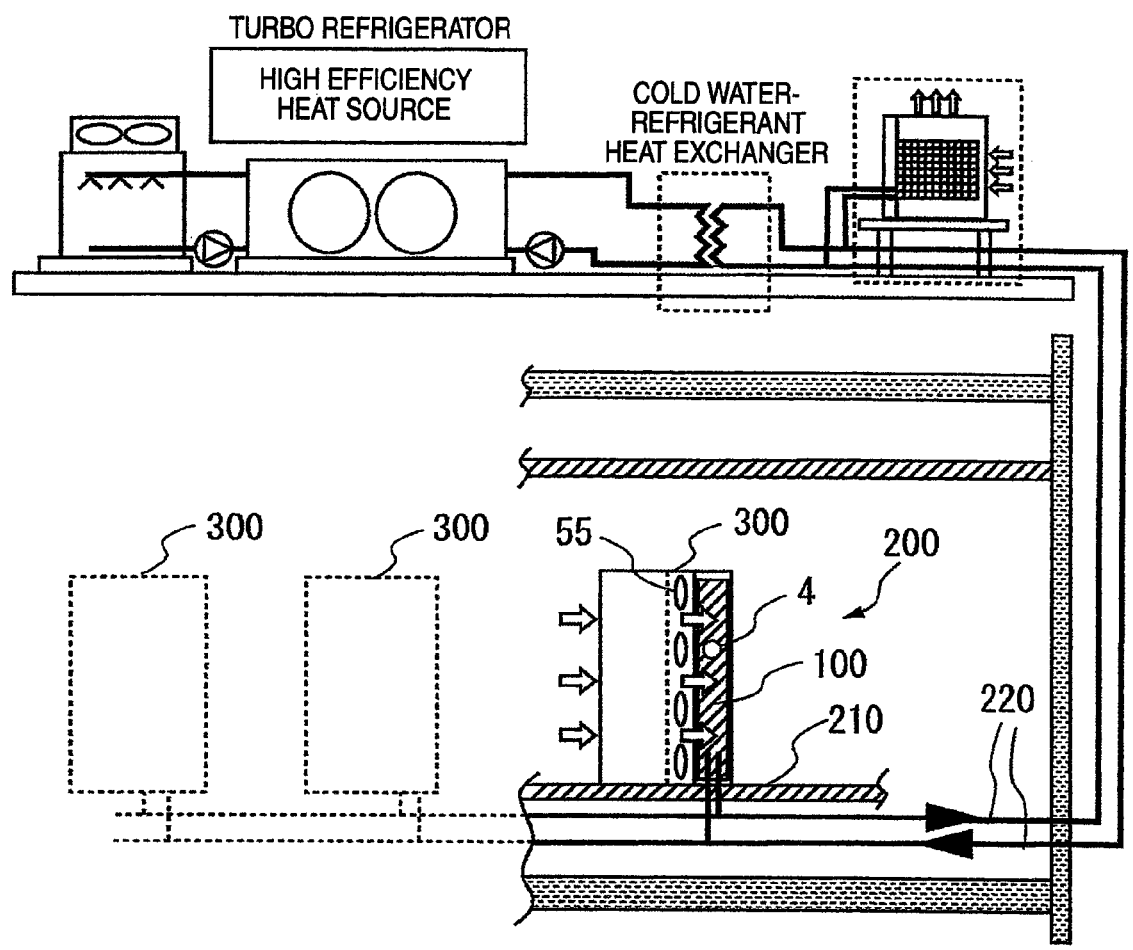
FIG. 10 is an explanatory view showing a general configuration of a free cooling system, which is a system for radiating heat from the cooling system according to the present invention to the atmosphere.

Hereinafter, a general configuration of a so-called free cooling system, which is a system for emitting heat from the above-described cooling system according to the present invention to the atmosphere, will be described with reference to FIG. 10. As described above, heat from one or more blade servers 300, which are installed in a server room 200 and contain the above-described cooling system of the present invention, is transferred from the air or water-cooled condenser 55 shown in FIG. 8A or 8B to, for example, an outdoor free cooling system through a refrigerant (secondary refrigerant) within pipes 220 arranged in a floor aspect 210 in the server room. In addition, in this example, the free cooling system further includes an air cooling unit for emitting heat to the atmosphere and a turbo refrigerator containing a high efficient source of heat through a cold water-refrigerant heat exchanger, as shown in the figure. Here, the free cooling system refers to a system in which water in a cooling tower, thus air cold heat, is used when air temperature is low, while a secondary refrigerant is cooled by cold water made by a refrigerator when the air temperature is high.

It should be further understood by those skilled in the art that although the foregoing description has been made on embodiments of the invention, the invention is not limited thereto and various changes and modifications may be made without departing from the spirit of the invention and the scope of the appended claims.

This application claims priority from Japanese Patent Application 2008-244242, filed Sep. 24, 2008, which is incorporated herein by reference in its entirety.

The invention claimed is:

1. An electronic apparatus in which a plurality of semiconductor devices are mounted on each of a plurality of electronic circuit boards which are detachably mounted within a housing, and which includes a cooling system for cooling the semiconductor devices on the plurality of electronic circuit boards mounted in the electronic apparatus,
  wherein the plurality of semiconductor devices mounted on each of the electronic circuit boards have different heat dissipation,
  wherein the cooling system includes:
  a thermosiphon which is provided for each of the electronic circuit boards and transfers heat from a first semiconductor device having relatively high heat dissipation among the plurality of semiconductor devices mounted on the electronic circuit board to an outside of the apparatus;
  a heat pipe which is provided for each second semiconductor devices having heat dissipation lower than that of the first semiconductor device on the electronic circuit board and transfers heat from the second semiconductor devices to the thermosiphon;
  a thermal highway, which is provided within the housing of the electronic apparatus, is thermally coupled to the thermosiphon by the mounting of the electronic circuit board into the housing, and thereby collects and transfers heat from the thermosiphon and the heat pipe; and
  a radiating unit which transfers the heat collected and transferred by the thermal highway outside the housing, and
  wherein heat transfer capacity by the thermosiphon is set to be higher than heat transfer capacity by the heat pipe and lower than heat transfer capacity by the thermal highway,
  wherein each of the electronic circuit boards is received in a respective housing, a first portion of the thermosiphon is thermally coupled to a surface of the first semiconductor device, and a second portion of the thermosiphon is opened to and arranged on the top surface of the housing,
  wherein a portion of the thermal highway is arranged to be opposite to the opened surface of the thermosiphon in the housing of the electronic apparatus,
  wherein a thermal connector is interposed between the opened surface of the thermosiphon and the opposite surface of the thermal highway, and
  wherein one end of the heat pipe is thermally coupled to a surface of the second semiconductor devices and the other end is thermally coupled to one surface of the thermosiphon.

2. The electronic apparatus according to claim 1,
  wherein the electronic apparatus is a rack-mount type blade server and the electronic circuit boards are blades constituting the blade server.

* * * * *